United States Patent
Yoshida

(10) Patent No.: US 8,089,274 B2
(45) Date of Patent: Jan. 3, 2012

(54) METHOD FOR EVALUATING SOI WAFER

(75) Inventor: Kazuhiko Yoshida, Nagano (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 459 days.

(21) Appl. No.: 12/227,687

(22) PCT Filed: May 10, 2007

(86) PCT No.: PCT/JP2007/059639
§ 371 (c)(1),
(2), (4) Date: Nov. 25, 2008

(87) PCT Pub. No.: WO2007/138828
PCT Pub. Date: Dec. 6, 2007

(65) Prior Publication Data
US 2009/0251135 A1  Oct. 8, 2009

(30) Foreign Application Priority Data
May 30, 2006 (JP) .................................. 2006-149866

(51) Int. Cl.
*G01R 33/14* (2006.01)
*G01R 31/26* (2006.01)
*G01B 7/06* (2006.01)

(52) U.S. Cl. ...................... 324/222; 324/229; 324/762.1

(58) Field of Classification Search .. 324/762.01–762.1, 324/754.01–754, 755.01–755.11, 525, 756.06, 324/757.03–757.05, 699, 691; 438/14–18; 257/48
See application file for complete search history.

(56) References Cited

U.S. PATENT DOCUMENTS

| 6,991,948 B2 * | 1/2006 | Hillard .......................... 438/17 |
| 7,063,991 B1 * | 6/2006 | Zhao et al. ...................... 438/14 |

FOREIGN PATENT DOCUMENTS

| JP | A 54-136182 | 10/1979 |
| JP | A 55-43880 | 3/1980 |
| JP | A 7-111321 | 4/1995 |
| JP | A 2000-277716 | 10/2000 |

* cited by examiner

*Primary Examiner* — Huy Q Phan
*Assistant Examiner* — Tung X Nguyen
(74) *Attorney, Agent, or Firm* — Oliff & Berridge, PLC

(57) ABSTRACT

The present invention relates to a method for evaluating the SOI wafer in a method for evaluating an SOI wafer in which a sheet resistance of a buried diffusion layer of an SOI wafer that has at least an SOI layer on an insulator layer and has a buried diffusion layer whose impurity concentration is higher than other region of the SOI layer in an interface area with the insulator layer of the SOI layer is evaluated, the method including the steps of measuring a sheet resistance of the whole SOI layer or the whole SOI wafer, and estimating the sheet resistance of the buried diffusion layer by assuming respective layers that compose the SOI wafer to be resistors connected in parallel and converting the measured result of the sheet resistance measurement. As a result of this, there is provided a method for evaluating the SOI wafer that can directly measure the SOI wafer itself to be the product to thereby evaluate the sheet resistance of the buried diffusion layer thereof, without fabricating a monitor wafer.

2 Claims, 6 Drawing Sheets

METHOD FOR EVALUATING SOI WAFER

TECHNICAL FIELD

The present invention relates to a method for evaluating a SOI wafer, and particularly relates to a method for evaluating a SOI wafer, in which characteristics of a buried diffusion layer are evaluated in the SOI wafer having the buried diffusion layer.

BACKGROUND ART

Although there is, for example, a silicon substrate which is generally used as a semiconductor substrate used in an integrated circuit, a semiconductor device with high speed and low power consumption is further required with improvement in speed and high integration of a system or development of a mobile terminal in recent years.

Under such a background, an SOI wafer having a SOI (Silicon On Insulator) structure in which a silicon active layer (SOI layer) is formed on an insulated layer can meet operation of devices with higher speed and low power consumption, and if the SOI wafer is used, device fabrication can be made without a significant change in established equipment, processes, or the like of device processes for a bulk wafer which does not have the SOI structure, so that the SOI wafer has been attracting attention as a wafer that can realize the operation of the devices with higher speed and low power consumption.

A general structure of such an SOI wafer is shown in FIG. 4. In an SOI wafer 10, a SOI layer 15 is formed on a supporting substrate 13 composed of silicon single crystal or the like so as to dispose a buried insulated layer 14 therebetween. Further, for convenience of the device fabrication or for the purpose of adding gettering capability or the like, a buried diffusion layer 12 in which impurities are diffused in high concentration is formed in an interface region in the SOI layer 15 with the insulated layer 14 in some cases as shown in FIG. 4. As forming in this way, the SOI layer 15 has the buried diffusion layer 12 and a low concentration layer 11 whose impurity concentration is lower than that in the buried diffusion layer.

The SOI wafer has been attracting a lot of attention as described above and accurate evaluation of characteristics of the SOI wafer has been required, so that various researches on the evaluation method have been currently conducted.

For example, evaluation of the characteristics on a surface of the SOI layer can be performed by contacting an electrode and a probe on front and back surfaces of the SOI wafer for measurement as disclosed in, for example, Japanese Unexamined Patent Publication (Kokai) No. 2000-277716, without using a four-point probe method. On the other hand, the buried diffusion layer 12 is buried in the SOI wafer, so that evaluation of characteristics of the layer has been difficult.

Conventionally, evaluation of sheet resistance of the buried diffusion layer of the SOI wafer has been performed by simultaneously fabricating a monitor wafer separately when manufacturing an SOI wafer to be a product as shown in, for example, FIG. 6.

Hereinafter, an example of a method for fabricating this monitor wafer to evaluate the sheet resistance of the buried diffusion layer will be described briefly.

First, while preparing a base wafer and a bond wafer for manufacturing the SOI wafer to be the product by a bonding method, a wafer to be the monitor wafer is prepared (a). Next, an oxide film is formed on the front surface of the base wafer (Box oxidization) (b). Next, screen oxidization of the surface (c) and impurity ion implantation (d) are simultaneously performed on both the bond wafer to be the active layer of the SOI wafer to be the product and the monitor wafer. As for the bond wafer, a screen oxide film is then removed (e), and the base wafer and the bond wafer are cleaned and subsequently subjected to bonding heat treatment (g), for example, under an oxygen atmosphere through a bonding process (f). Thereafter, thinning the bond wafer is then performed by, for example, grinding and polishing (h), and are further polished and cleaned (i) to fabricate the product SOI wafer (l). As for the monitor wafer, it is subjected to heat treatment under a nitrogen atmosphere (g) separately from the SOI wafer to be the product and subsequently a screen oxide film is removed (j). The evaluation of the buried diffusion layer of the SOI wafer to be the product has been performed indirectly by measuring sheet resistance of a high-impurity concentration diffusion layer thus formed on the monitor wafer (k).

According to such a method, however, there has been a problem that the impurity concentration is likely to change depending on the atmosphere during the heat treatment.

Consequently, there has been proposed a method in which the monitor wafer having the same SOI structure as that of the product SOI wafer is fabricated, and after exposing the buried diffusion layer formed in this monitor wafer to a surface by grinding, polishing, etching, or the like, the buried diffusion layer of the product SOI wafer is evaluated by measuring the sheet resistance of the exposed buried diffusion layer.

According to the above-mentioned method, however, there has been problems that a cost for fabricating the monitor wafer is further increased, such that, a material cost or the number of processes is increased, due to fabricating the monitor wafer having the SOI structure other than the product SOI wafer.

Consequently, there has been disclosed a method in which the SOI structure of the monitor wafer is not completely reproduced, and after forming the impurity diffusion layer in the monitor wafer, processing is performed while a surface of this impurity diffusion layer is capped with a CVD film to then monitor the buried diffusion layer of the SOI wafer (Japanese Unexamined Patent Publication (Kokai) No. H7-111321).

However, it is still required to fabricate the monitor wafer even by the above-mentioned method, so that the problem of the cost, such as the material cost, the number of processes, or the like for fabricating the monitor wafer has not been solved yet.

Moreover, according to the above-described method for fabricating the monitor wafer to indirectly evaluate the sheet resistance of the buried diffusion layer of the product SOI wafer, since the product SOI wafer is not directly evaluated, quality assurance of the product SOI wafer has not been enough.

DISCLOSURE OF THE INVENTION

Therefore, the present invention is made in view of such problems, and an object thereof is to provide a method for evaluating the SOI wafer that can directly measure the SOI wafer itself to be the product to thereby evaluate the sheet resistance of the buried diffusion layer thereof, without fabricating the monitor wafer.

The present invention is made to solve the above described problems, and an object thereof is to provide a method for evaluating an SOI wafer characterized in that in a method for evaluating an SOI wafer in which a sheet resistance of a buried diffusion layer of an SOI wafer that has at least an SOI layer on an insulator layer and has a buried diffusion layer whose impurity concentration is higher than other region of the SOI layer in an interface area with the insulator layer of the SOI layer, the method including the steps of measuring a sheet resistance of the whole SOI layer or the whole SOI wafer, and estimating the sheet resistance of the buried diffusion layer by assuming respective layers that compose the SOI wafer to be resistors connected in parallel and converting the measured result of the sheet resistance measurement.

As described above, in the method for evaluating the sheet resistance of the buried diffusion layer of the SOI wafer having the buried diffusion layer, when the sheet resistance of the whole SOI layer or the whole SOI wafer is measure, and the sheet resistance of the buried diffusion layer is estimated by assuming and converting the measured results of the sheet resistance as the resistance of respective layers that compose the SOI wafer being connected in parallel, the sheet resistance of the buried diffusion layer of the SOI wafer to be a product can be directly evaluated nondestructively. For this reason, the buried diffusion layers of all the manufactured SOI wafers can also be inspected, thus allowing quality of the SOI wafers to be assured. Moreover, since the monitor wafer is not needed, a material cost and the number of processes for fabricating the monitor wafer can be reduced.

In this case, measuring the sheet resistance of the whole SOI wafer can include the steps of radiating lines of magnetic force of an alternating current magnetic field to one surface of the SOI wafer to form eddy currents caused by the alternating current magnetic field on the SOI wafer, measuring variation of the magnetic field according to eddy current loss generated by the eddy current formation, on a surface opposite to the surface to which the lines of magnetic force are radiated, and calculating the sheet resistance of the whole SOI wafer from the measured variation of the magnetic field.

As described above, if the sheet resistance of the whole SOI wafer is measured by the method for measuring the variation of the magnetic field caused by the eddy currents, the sheet resistance of the buried diffusion layer of the SOI wafer can be evaluated without contacting the SOI wafer with a measuring instrument. Thus, since the SOI wafer can be evaluated without contacting the SOI wafer, there is no need to clean the wafer after the evaluation.

In addition, measuring the sheet resistance of the whole SOI layer can be performed by applying a four-point probe method to a surface of the whole SOI layer.

As described above, if sheet resistance measurement of the whole SOI layer is performed by applying the four-point probe method to the surface of the SOI layer, the sheet resistance of the buried diffusion layer of the SOI wafer can be evaluated by a simpler measuring instrument. In this case, although the probes shall be contacted with the surface of the SOI layer, there is no problem if cleaning or polishing is performed after the evaluation.

According to the present invention, the sheet resistance of the buried diffusion layer of the SOI wafer to be the product can be directly evaluated without fabricating the monitor wafer. As a result, a material cost or a cost of the number of processes or the like for fabricating the monitor wafer can be reduced. Moreover, all the product SOI wafers can also be tested, and thus the quality thereof can be fully assured.

BEST MODE(S) FOR CARRYING OUT THE INVENTION

Hereinafter, the present invention will be described more specifically.

As described above, according to the conventional method for fabricating a monitor wafer separately from an SOI wafer to be a product to measure sheet resistance of a front surface of the monitor wafer in which a high concentration diffusion layer (buried diffusion layer) is exposed (hereinafter, it may be referred to as a monitor wafer method), there have been problems that a cost for fabricating the monitor wafer is required in addition to a cost for manufacturing the product SOI wafer and the product SOI wafer cannot be evaluated directly.

Consequently, the inventor considered earnestly whether or not sheet resistance of the buried diffusion layer of the SOI wafer to be the product could be directly evaluated without fabricating the monitor wafer.

As a result of it, the inventor has found out that as for the product SOI wafer, sheet resistance of a whole SOI wafer or a whole SOI layer is measured, and the sheet resistance of the buried diffusion layer of the product SOI wafer can be estimated by considering and converting the measured results as a resistance of each layers composing the SOI wafer being connected in parallel respectively, and completed the present invention.

Hereinafter, the present invention will be described more specifically with reference to the drawings, but it is not limited thereto.

Figure 5:
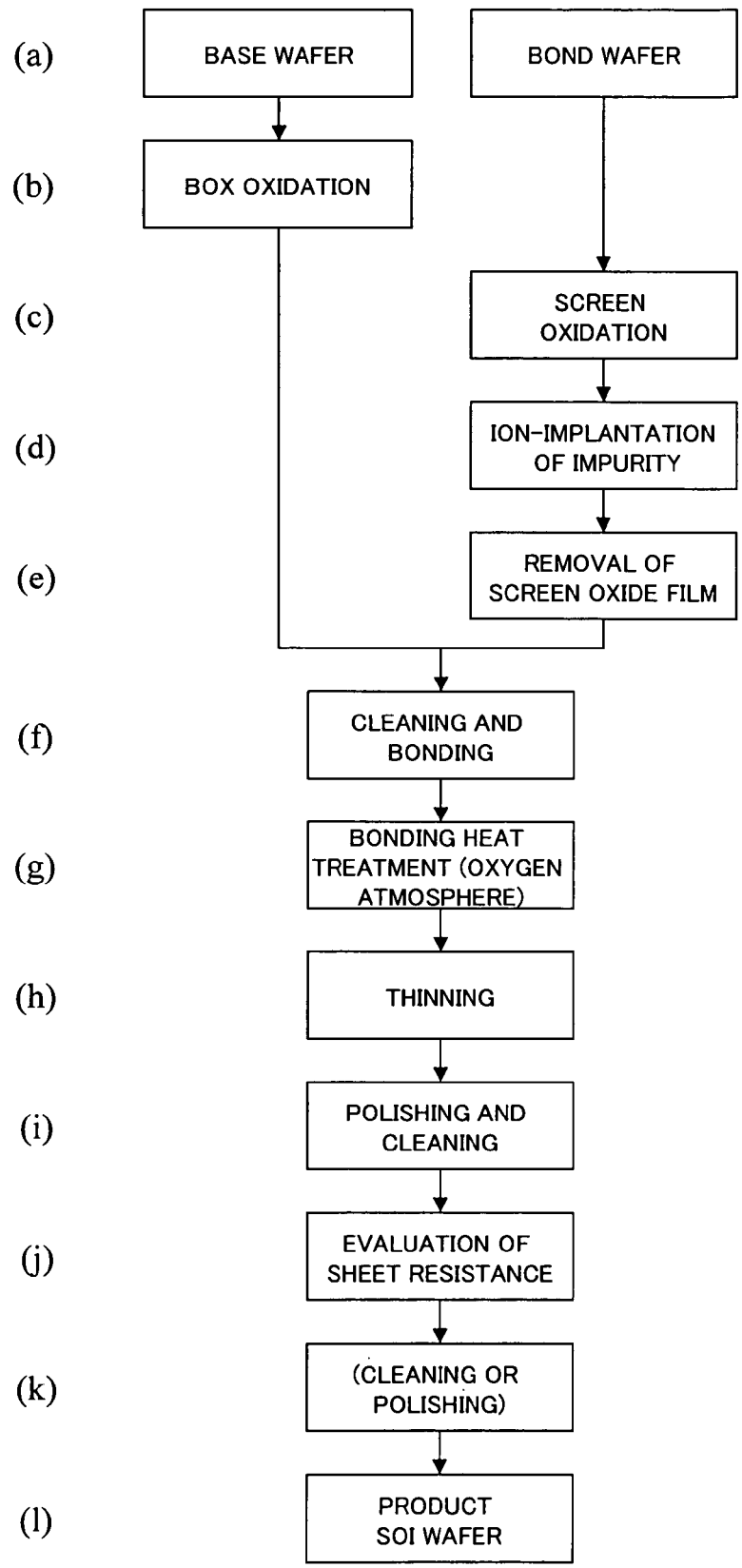
FIG. 5 is a flow chart showing a method for evaluating a buried diffusion layer of a product SOI wafer without fabricating the monitor wafer according to the present invention.

An example of a method for evaluating the sheet resistance of the buried diffusion layer of the SOI wafer according to the present invention is schematically shown in FIG. 5.

Steps (a) to (i) in FIG. 5 show processes for manufacturing the SOI wafer, which has the SOI layer on the insulated layer and has the buried diffusion layer in an interface area in the SOI layer with the insulated layer, according to the usual method.

Figure 6:
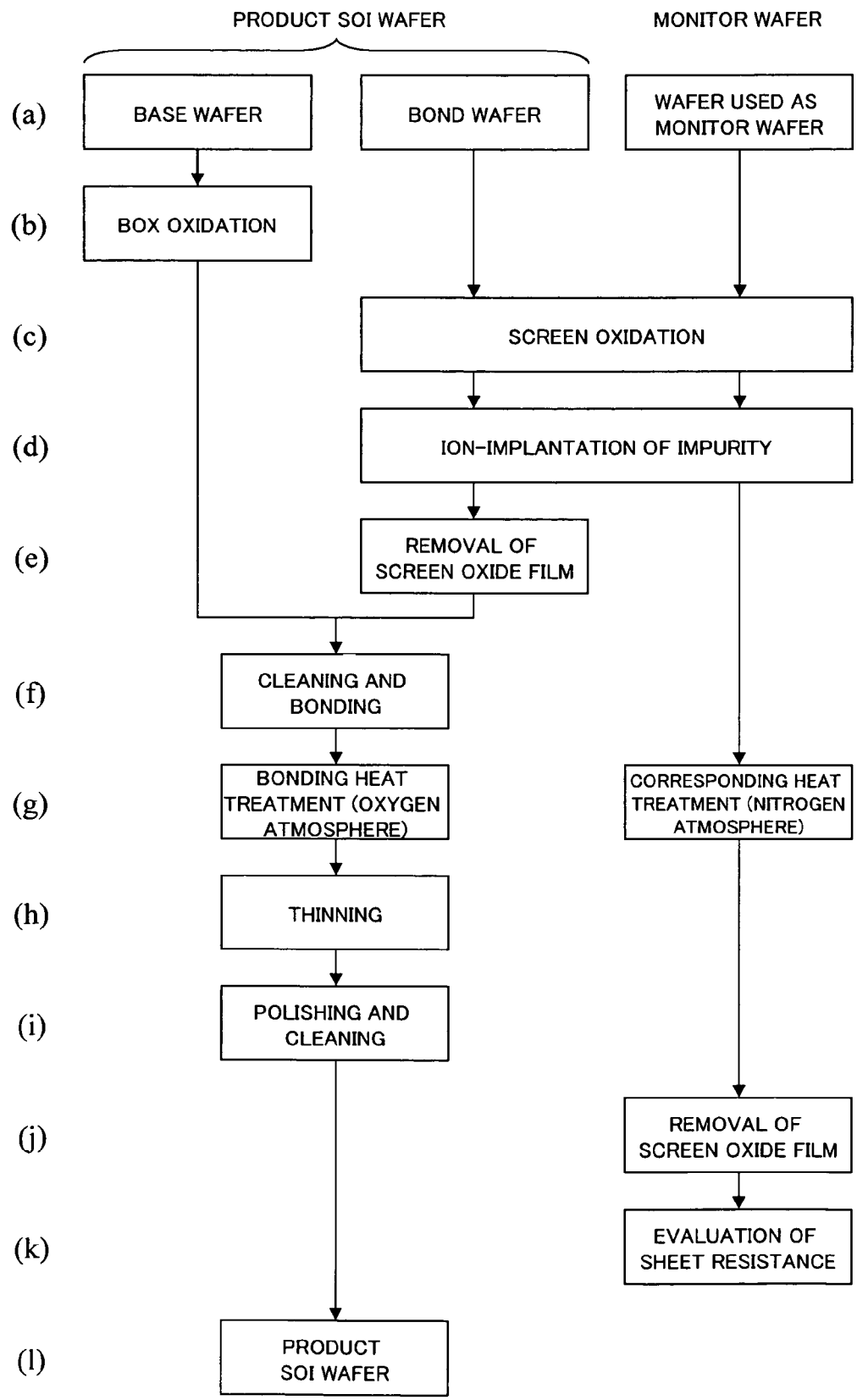
FIG. 6 is a flow chart showing a conventional method for fabricating the monitor wafer to evaluate the buried diffusion layer of the product SOI wafer.

Namely, the SOI wafer can be manufactured in a same way as with a conventional method for manufacturing the product SOI wafer in FIG. 6. However, there is no need to fabricate the monitor wafer compared with the method for evaluating the buried diffusion layer of the SOI wafer with the conventional method in FIG. 6.

The SOI wafer fabricated in this way is then subjected to sheet resistance measurement at step (j) with the method for evaluating the SOI wafer according to the present invention. However, the method for manufacturing the SOI wafer is not limited to the above-described (a) to (i) in FIG. 5, but the SOI wafer may be manufactured with any manufacturing method as long as it is the method for manufacturing the SOI wafer having the buried diffusion layer. Further, after measuring the sheet resistance of the buried diffusion layer at step (j), the SOI wafer is cleaned as needed (k) to make the product SOI wafer (l). A specific method of the sheet resistance measurement at step (j) which is an essential part of the present invention will be described later.

Figure 4:
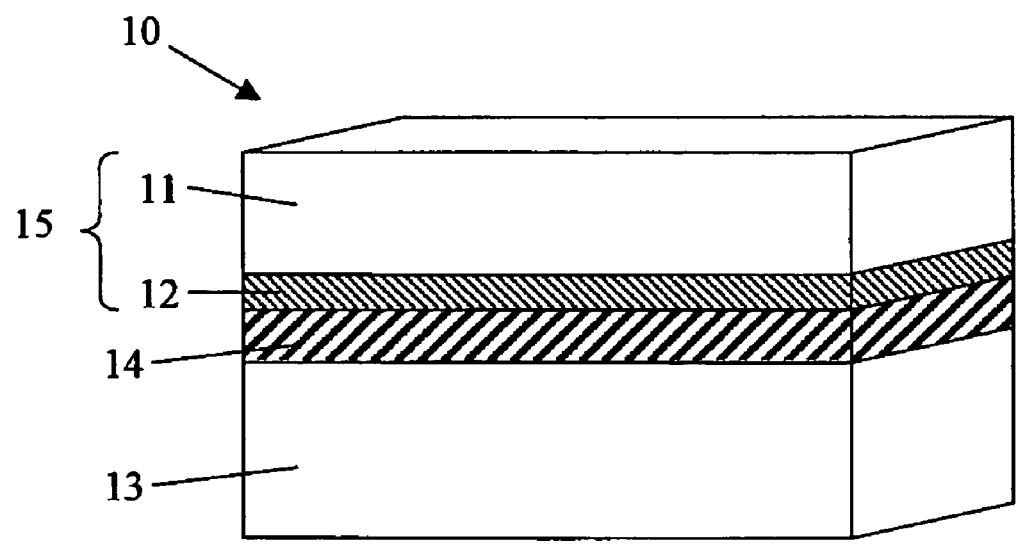
FIG. 4 is a schematic view showing an SOI wafer having a general buried diffusion layer.

Here, the SOI wafer manufactured in this way is the conventional SOI wafer having the buried diffusion layer as shown in FIG. 4.

While FIG. 4 shows an SOI wafer 10 in which a supporting substrate 13, a buried insulated layer 14, and a SOI layer 15 composed of a buried diffusion layer 12 and a low impurity concentration layer 11 whose concentration is lower than that of the buried diffusion layer are stacked, the structure of the SOI wafer to which the present invention is applied is not limited to this. For example, it may be an SOI wafer in which a silicon layer is directly formed on an insulator substrate. Alternatively, the buried insulated layer is not limited to the silicon oxide film, but the insulated layer may be a nitride film or the like.

One of embodiments according to the present invention is a method for measuring the sheet resistance of the whole SOI wafer and estimating the sheet resistance of the buried diffusion layer from the measured results by an eddy current method as described below.

Hereinafter, an evaluation method of the sheet resistance of the buried diffusion layer by the eddy current method will be described with reference to FIG. 1.

Figure 1:
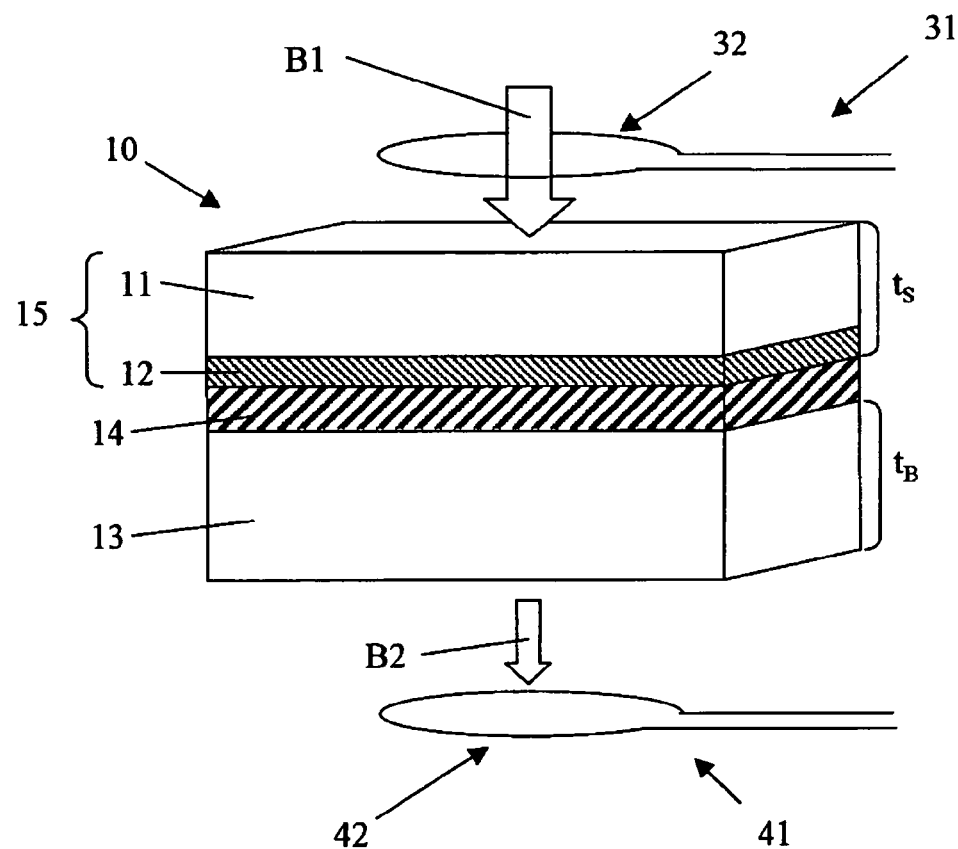
FIG. 1 is a schematic view showing an aspect of measuring resistivity of a whole SOI wafer by an eddy current method according to the present invention.

First, an alternating current magnetic field B1 is radiated to one surface of the SOI wafer 10 (in FIG. 1, it is a front surface of the SOI layer 15). As a method for radiating the alternating current magnetic field B1, an alternating current can be made to flow through a magnetic field radiation head 31 having a coil 32 as shown in FIG. 1, for example, and according to such a method, the alternating current magnetic field can be radiated using an apparatus with a simple structure.

The alternating current magnetic field B1 thus radiated penetrates through each layer of the SOI wafer 10, namely, the low concentration layer 11, the buried diffusion layer 12, the buried insulated layer 14, and the supporting substrate 13. Since the radiated magnetic field is the alternating current, the magnetic field in each layer of the SOI wafer 10 changes, and eddy currents are generated around a magnetic flux in each layer by an electromagnetic induction action so as to counteract the change in the magnetic field. However, since the buried insulated layer 14 is an insulator, the eddy currents to be generated are small enough to be ignored.

The eddy currents thus generated on each layer of the SOI wafer 10 causes energy loss (eddy current loss) by Joule heat. However, since the eddy currents generated in the buried insulated layer 14 is small enough to be ignored as described above, the eddy current loss can also be ignored. The alternating current magnetic field B1 radiated on the SOI wafer 10 penetrates through the whole SOI wafer, and then changes according to the above-described eddy current loss into a magnetic field B2 on a surface opposite to the radiated one.

In order to measure this magnetic field B2, a measuring head 41 having a coil 42 may be used, for example. Due to a change with the passage of time in the magnetic field B2, currents flow through the coil 42 by electromagnetic induction. A tester or the like which is not shown is connected to the measuring head 41, and resistivity $\rho$ of the whole SOI wafer 10 is measured.

Subsequently, the sheet resistance of the buried diffusion layer 12 can be calculated from this resistivity $\rho$ of the whole SOI wafer 10 as henceforth described.

Letting whole resistance of the SOI wafer 10 be R, a film thickness of the SOI layer 15 be $t_s$, and a thickness of the supporting substrate 13 be $t_B$, and considering that respective layers of the SOI layer 15, namely, the low concentration layer 11 and the buried diffusion layer 12, are resistances connected in parallel, the resistivity $\rho$ of the whole SOI wafer 10 is represented by Equation 1.

[Equation 1]

$$\rho = R \times (t_S + t_B) \quad (1)$$

However, since the buried insulated layer 14 is the insulator, influence of the resistance thereof on the whole resistance can be ignored. The whole resistance R and the resistivity $\rho$ can be converted to each other by Equation (1).

Now, let the sheet resistances of the low concentration layer 11, the buried diffusion layer 12, and the supporting substrate 13 be $R_1$, $R_2$, and $R_3$, respectively, the sheet resistance R of the whole SOI wafer can be represented by Equation (2).

[Equation 2]

$$R = \frac{1}{\frac{1}{R_1} + \frac{1}{R_2} + \frac{1}{R_3}} \quad (2)$$

However, since the buried insulated layer 14 is the insulator, influence due to the resistance of the buried insulated layer 14 can be ignored.

Note let the resistivity, and the film thickness or the thickness of the low concentration layer 11, the buried diffusion layer 12, and the supporting substrate 13 be $\rho_1$, $t_1$, $\rho_2$, $t_2$, $\rho_3$, and $t_3$, respectively, Equation (3) is obtained.

[Equation 3]

$$R_1 = \frac{\rho_1}{t_1},$$
$$R_2 = \frac{\rho_2}{t_2}, \quad (3)$$
$$R_3 = \frac{\rho_3}{t_3}$$

Among these, since at least the resistivity $\rho_3$ and the thickness $t_3$ of the supporting substrate 13 can be measured in advance, at least the sheet resistance $R_3$ of the supporting substrate 13 has been found out before manufacturing the SOI wafer.

Meanwhile, in the SOI wafer having the buried diffusion layer, it is $R_1 >> R_3 > R_2$ in general, and especially $R_1$ is large (for example, $R_1$ is several kilo-ohms, $R_2$ is tens of ohms, and $R_3$ is hundreds of ohms). Accordingly, Equation (2) can be approximated as Equation (4).

[Equation 4]

$$R \approx \frac{1}{\frac{1}{R_2} + \frac{1}{R_3}} \quad (4)$$

In Equation (4), the sheet resistance $R_3$ of the supporting substrate 13 is already known as described above.

Figure 7:
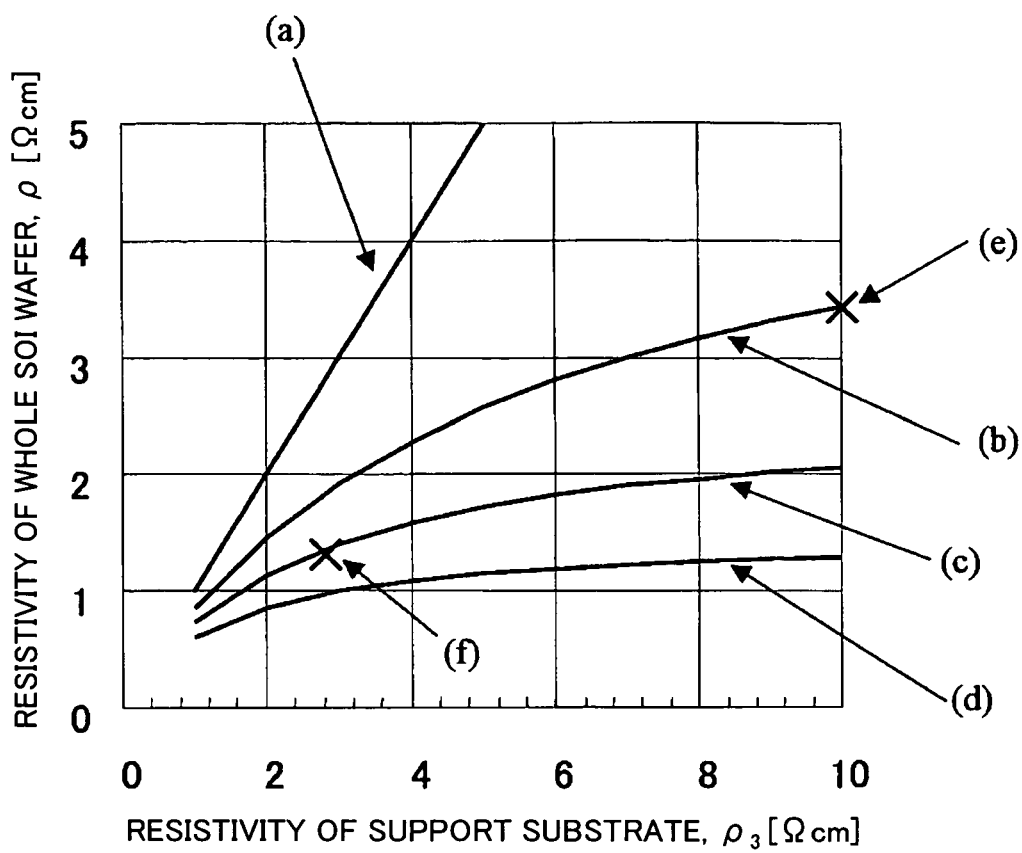
FIG. 7 is a graph plotting a curve showing a relation between resistivity of a supporting substrate and that of the whole SOI wafer calculated by an approximate equation (4), and a curve showing resistivity of the whole SOI wafer measured in an experimental example.

From approximate equation (4) obtained in this way, a relation between the resistivity $\rho 3$ of the supporting substrate 13 and the resistivity $\rho$ of the whole SOI wafer 10 is calculated and shown in FIG. 7. Note that the film thickness $t_s$ of the SOI layer 15 is set to 15 μm, the film thickness $t_2$ of the buried diffusion layer 12 is 2 μm, and the thickness $t_B$ of the supporting substrate 13 is 725 μm in a general specification, and a curve (a) shows a relation when the buried diffusion layer is not formed, while curves (b), (c), and (d) show relations when the sheet resistance $R_2$ of the buried diffusion layer 12 is 70Ω/□, 35Ω/□, and 20Ω/□, respectively.

Figure 8:
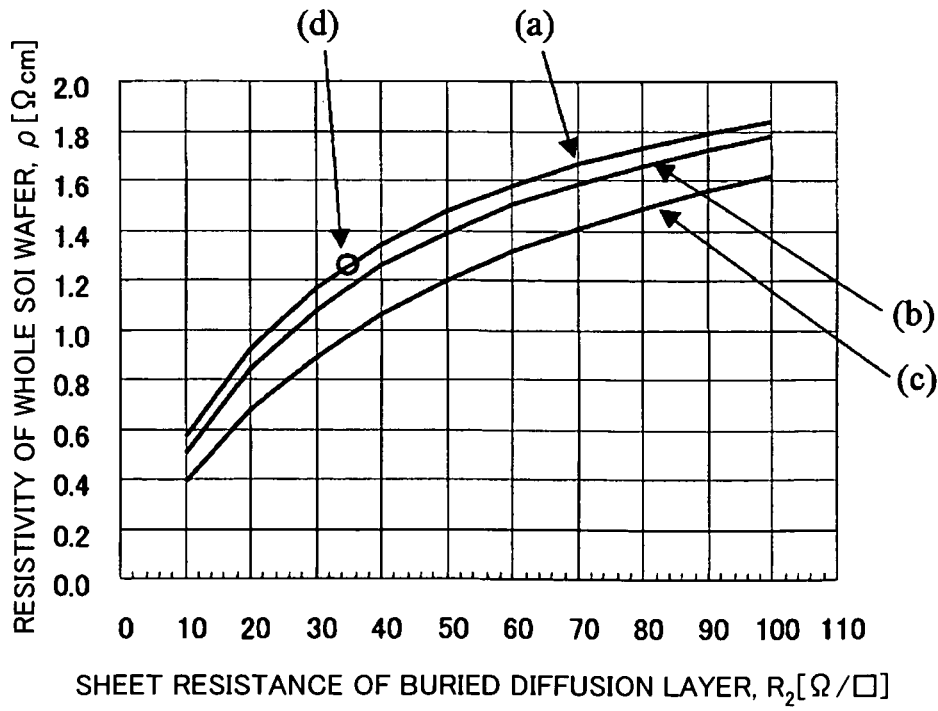
FIG. 8 is a graph plotting a curve showing a relation between sheet resistance of the buried diffusion layer and that of the whole SOI wafer calculated with approximate equation (4), and a curve showing resistivity of the whole SOI wafer measured in the experimental example.

Additionally, a relation between the sheet resistance $R_2$ of the buried diffusion layer 12 and the resistivity $\rho$ of the whole SOI wafer 10 is calculated from approximate equation (4) and is shown in FIG. 8. Note that curves (a), (b), and (c) show the relations when the resistivity $\rho 3$ of the supporting substrate 13 is 2.4 Ω·cm and the thickness $t_3$ are 725 μm, 625 μm, and 450 μm, respectively.

Incidentally, when Equation (4) is transformed about the sheet resistance $R_2$ of the buried diffusion layer 12, it is represented as Equation (5).

[Equation 5]

$$R_2 \approx \frac{1}{\frac{1}{R} - \frac{1}{R_3}} \quad (5)$$

Namely, since the sheet resistance $R_3$ obtained from the resistivity $\rho_3$ and the thickness $t_3$ of the supporting substrate 13 is already known as described above, the sheet resistance $R_2$ of the buried diffusion layer 12 can be obtained from the whole resistance R of the SOI wafer 10 measured as described above.

As described above, the inventor found out that the sheet resistance $R_2$ of the buried diffusion layer can be calculated by measuring the whole resistance R of the SOI wafer 10 as the variation of the magnetic field and converting the whole resistance R according to approximate equation (5).

Consequently, the following experiments were performed in order to confirm that this theory is practically applicable.

First Experimental Example

Figure 3:
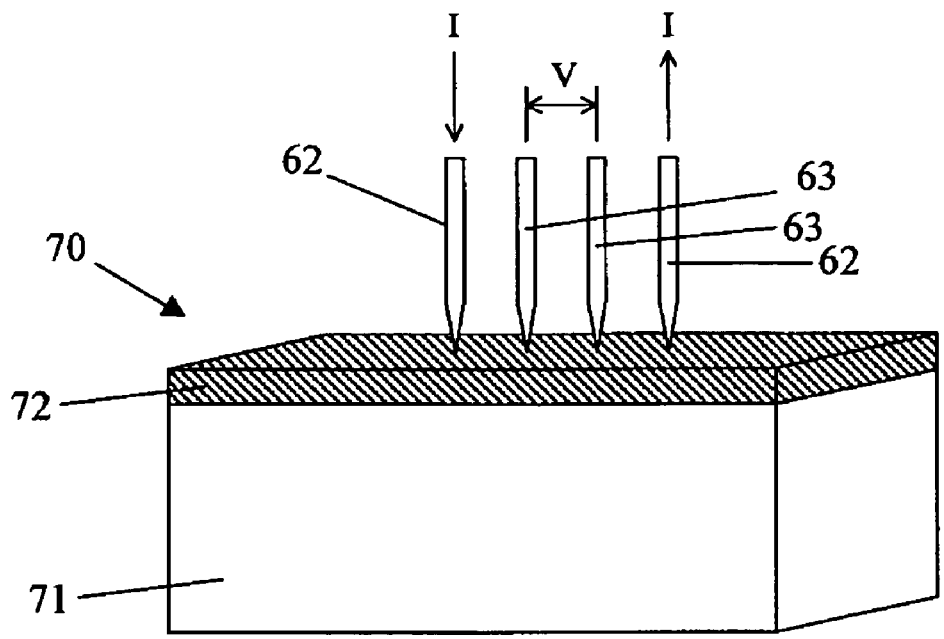
FIG. 3 is a schematic view showing an aspect of measuring sheet resistance of a high concentration diffusion layer of a monitor wafer.

According to a conventional method for manufacturing the SOI wafer and the monitor wafer as shown in FIG. 6, the SOI wafer 10 having the buried diffusion layer 12 as shown in FIG. 4, and a monitor wafer 70 corresponding thereto as shown in FIG. 3, namely, a monitor wafer having a high concentration diffusion layer 72 formed on a front surface area of a silicon wafer 71 were fabricated. However, the base wafer to be the supporting substrate 13 was used in which the conductive type is p-type, the resistivity is 10 Ω·cm, and the thickness is 725 μm, and the dose amount of arsenic to be ion-implanted was set to $1 \times 10^{15}$ atoms/cm$^2$, and the film thickness $t_2$ of the buried diffusion layer 12 was 2 μm.

The product SOI wafer manufactured in this way was subjected to sheet resistance measurement of the buried diffusion layer 12 by the eddy current method of the present invention, and the resistivity $\rho_2$ of the buried diffusion layer 12 was obtained. The results were shown as a point (e) in FIG. 7.

Additionally, as for the fabricated monitor wafer 70, a sheet resistance $R_s$ of the high concentration diffusion layer 72 was measured by measuring the sheet resistance of the surface of the high concentration diffusion layer 72 as the measuring surface, using the four-point probe method in which current probes 62 and voltage probes 63 and 63 were pressed to the surface.

As a result of this, the sheet resistance was about 70Ω/□.

It turns out that the point (e) almost corresponds to the curve (b) obtained from above-described approximate equation (4) by letting the sheet resistance $R_2$ be 70Ω/□.

Second Experimental Example

The product SOI wafer and the monitor wafer were fabricated in a manner similar to that of the first experimental example except for ion-implanting the dose amount of arsenic of $2 \times 10^{15}$ atoms/cm$^2$ into a p-type silicon wafer with a resistivity of 2.4 Ω·cm, and the sheet resistance $R_2$ of the buried diffusion layer was evaluated. The results were shown as a point (f) in FIG. 7.

Additionally, as for the monitor wafer, the sheet resistance $R_s$ of the high concentration diffusion layer 72 was measured by the four-point probe method in a manner similar to that of the first experimental example.

As a result of this, the sheet resistance of the monitor wafer was about 35Ω/□. The results were shown as a point (d) in FIG. 8.

It turns out that the point (f) shown in FIG. 7 almost corresponds to the curve (c) obtained from above-described approximate equation (4) by letting the sheet resistance $R_2$ be 35Ω/□.

It turns out that the point (d) shown in FIG. 8 almost corresponds to a point of 35Ω/□ sheet resistance in the curve (a) obtained from above-described approximate equation (4) by letting the thickness of the supporting substrate 13 be 725 μm.

From the results of the first and second experimental examples, since the points (e) and (f) shown in FIG. 7, and the point (d) shown in FIG. 8 almost correspond to the curves obtained from above-described approximate equation (4); respectively, it has become clear that an assumption according to the present invention that respective layers composing the SOI wafer are assumed to be the sheet resistances connected in parallel is appropriate, and that the sheet resistance evaluation of the buried diffusion layer according to the present invention provides almost the same result as that of a case by the conventional method for fabricating the monitor wafer to measure the sheet resistance of the high concentration diffusion layer corresponding to the buried diffusion layer.

In the embodiment, the sheet resistance of the buried diffusion layer can be calculated approximate equation (5). Hence, in a condition that Equation (2) is better approximated to approximate equation (4), namely, the larger $R_1$ is and the larger the difference from $R_2$ and $R_3$ is, the more correctly the $R_2$ can be estimated.

Additionally, since the higher the frequency of the incoming alternating current magnetic field B1 is, the larger the eddy current loss becomes, variation of the magnetic field between B1 and B2 is increased. When it is performed as described above, the sheet resistance of the whole SOI wafer 10 can be preferably measured with less error.

As described above, it is determined as the product SOI wafer after evaluating the sheet resistance of the buried diffusion layer 12. In other words, the sheet resistance of the buried diffusion layer of the product SOI wafer can be directly evaluated. Note herein that, since measuring the sheet resistance of the whole SOI wafer 10 by this eddy current method can be performed without contacting with a measuring instrument, there is no fear of generating dust or the like, and a cleaning process (step (k) in FIG. 5) after the measurement can also be omitted.

Another embodiment of the present invention is a method for measuring the sheet resistance of the whole SOI layer by applying the four-point probe method on the surface of the SOI layer to thereby estimate the sheet resistance of the buried diffusion layer from the measured results.

Figure 2:
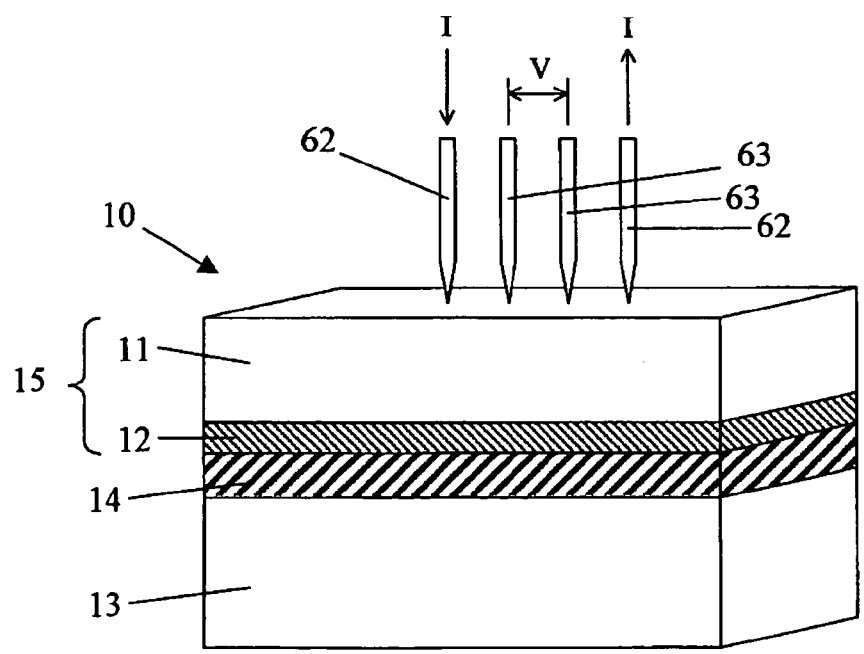
FIG. 2 is a schematic view showing an aspect of measuring resistivity of a whole SOI layer with a four-point probe method according to the present invention.

Hereinafter, an evaluation method of the sheet resistance of the buried diffusion layer by the four-point probe method will be described with reference to FIG. 2.

First, the current probes 62 and 62 and the voltage probes 63 and 63 are pressed to the surface of the SOI layer 15 of the SOI wafer 10 to measure a sheet resistance $R_{SOI}$ of the whole SOI layer 15 by the four-point probe method. Incidentally, the four-point probe method is a technique for measuring the sheet resistance of that sample in such a way that total four probes of the current probes 62 and 62 and the voltage probes 63 and 63 are pressed to a sample surface (here, the surface of the SOI layer 15) while arranging them linearly and at almost equal intervals, and a current I is made to flow between the current probes 62 and 62 to thereby measure a voltage between the voltage probes 63 and 63.

In this embodiment, it is essential that the sheet resistance of the whole SOI layer 15 including the buried diffusion layer 12 can be measured. Namely, when the SOI layer is junction-separated by a diode structure or the like, for example, when a conductivity type of the buried diffusion layer 12 is p-type and a conductivity type of the low concentration layer 11 is n-type, the sheet resistance of the whole SOI layer 15 cannot be measured from the surface of the SOI layer 15 by the four-point probe method, so that the present embodiment cannot be applied.

It is to be noted that since the supporting substrate 13 is insulated from the SOI layer 15 by the buried insulated layer 14 in this method, the supporting substrate 13 does not have an influence on the measurement.

From the sheet resistance of the whole SOI layer 15 measured by the four-point probe method in this way, the sheet resistance of the buried diffusion layer 12 is estimated.

The following calculation is performed by assuming that respective layers of the SOI layer 15, namely, the low concentration layer 11 and the buried diffusion layer 12 are resistances connected in parallel. By this assumption, Equation (6) is obtained.

[Equation 6]

$$R_{SOI} = \frac{1}{\frac{1}{R_1} + \frac{1}{R_2}} \quad (6)$$

When this equation is transformed, Equation (7) is obtained.

[Equation 7]

$$R_{SOI} = \frac{R_2}{1 + \frac{R_2}{R_1}} \quad (7)$$

Here, since the impurity concentration of the buried diffusion layer 12 is higher than that of the low concentration layer 11, it can be considered that $R_1 > R_2$, and assuming that $R_1$ is larger enough than $R_2$, Equation (7) can be approximated to Equation (8).

[Equation 8]

$$R_{SOI} \approx R_2 \quad (8)$$

Meanwhile, in a condition that Equation (7) is better approximated to approximate equation (8), namely, the larger the difference between $R_1$ and $R_2$ is, the more correctly the $R_2$ can be preferably estimated. For example, the difference is large enough if the $R_2$ is not more than 100Ω/□ when the $R_1$ is not less than 1 kΩ/□.

Incidentally, according to the four-point probe method, since there is a possibility that the probes contact to the surface of the SOI layer to generate contamination, such as dust or the like on the front surface of the SOI wafer, it is preferable to clean or polish, after measuring the sheet resistance $R_{SOI}$, the SOI wafer before determining it as the product SOI wafer (FIG. 5 (k)).

After evaluating the sheet resistance $R_2$ of the buried diffusion layer 12 in this way, the SOI wafer is determined as the product SOI wafer (FIG. 5 (l)).

If the method for evaluating the SOI wafer by measuring the sheet resistance of the whole SOI layer using the four-point probe method is employed, the sheet resistance of the buried diffusion layer can be directly evaluated without fabricating the monitor wafer and with the simple method.

EXAMPLES

Hereinafter, the present invention will be described more specifically showing embodiments of the present invention, but it is not limited thereto.

Example 1 and Comparative Example 1

Five SOI wafers having the buried diffusion layers were manufactured by the usual method according to steps (a) to (i) shown in FIG. 5. Note that arsenic was ion-implanted in order to form the buried diffusion layer (high concentration diffusion layer in the case of the monitor wafers). An accelerating voltage of this ion implantation was set to 100 keV, the dose amount were (1) $1 \times 10^{15}$ atoms/cm$^2$, (2) $2 \times 10^{15}$ atoms/cm$^2$, and (3) $4 \times 10^{15}$ atoms/cm$^2$, the film thickness of the buried diffusion layer was 2 μm, and the number of the SOI wafers for dose amount were one, three, and one wafers, respectively.

Additionally, one monitor wafer for each SOI wafer, namely, five monitor wafers in total were fabricated according to fabricating processes of the monitor wafer shown in FIG. 6 simultaneously with manufacturing the SOI wafers.

As for the respective SOI wafers, after measuring the actual resistance R by the eddy current method, the sheet resistance $R_2$ of the buried diffusion layers was obtained by calculation (Example 1).

While, the sheet resistance $R_s$ of the high concentration diffusion layer (corresponding to the buried diffusion layers of the SOI wafer) of the monitor wafer was measured (Comparative Example 1).

Figure 9:
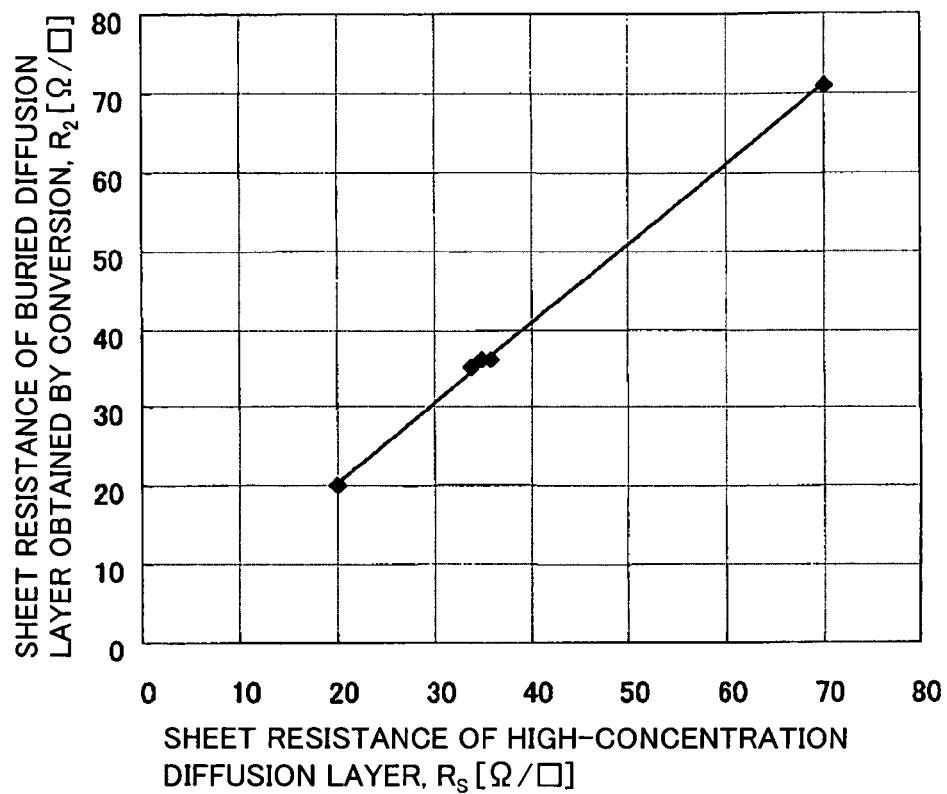
FIG. 9 is a graph showing a correlation between the sheet resistance of the buried diffusion layer evaluated with a method for evaluating the buried diffusion layer according to the eddy current method of the present invention and the sheet resistance of the high concentration diffusion layer measured on the monitor wafer.

The resistances $R_2$ and $R_s$ obtained in this way were compared with each other, and a relation between them was shown in FIG. 9. Note that a straight line in FIG. 9 is an approximate straight line by a least-squares method. As can be seen from FIG. 9, both were almost matched with each other even in any dose amounts in the above-described (1), (2), and (3).

Namely, it means that almost the same result as that of the conventional monitor wafer method can be obtained. Consequently, the sheet resistance of the buried diffusion layer of the SOI wafer could be evaluated without fabricating the monitor wafer.

Example 2 and Comparative Example 2

As in Example 1, according to the processes (a) to (i) shown in FIG. 5, ten sheets of SOI wafers having the buried diffusion layers were manufactured by the usual method. An accelerating voltage was set to 100 keV in the ion implantation of arsenic, and dose amount was fine-tuned to change in the range of $2\times10^{15}$ atoms/cm$^2$ to $4\times10^{15}$ atoms/cm$^2$.

Additionally, as in Example 1, one sheet of monitor wafer for each of the ten SOI wafers, namely, a total of ten monitor wafers were fabricated.

As for the each SOI wafer, the sheet resistance $R_{SOI}$ of the whole SOI layer was measured by the four-point probe method, and then, this $R_{SOI}$ was determined to be equal to the sheet resistance $R_2$ of the buried diffusion layer according to a principle of the present invention (Example 2).

On the other hand, the sheet resistance $R_s$ of the high concentration diffusion layers (corresponding to the buried diffusion layers of the SOI wafers) of the monitor wafers was measured (Comparative Example 2).

Figure 10:
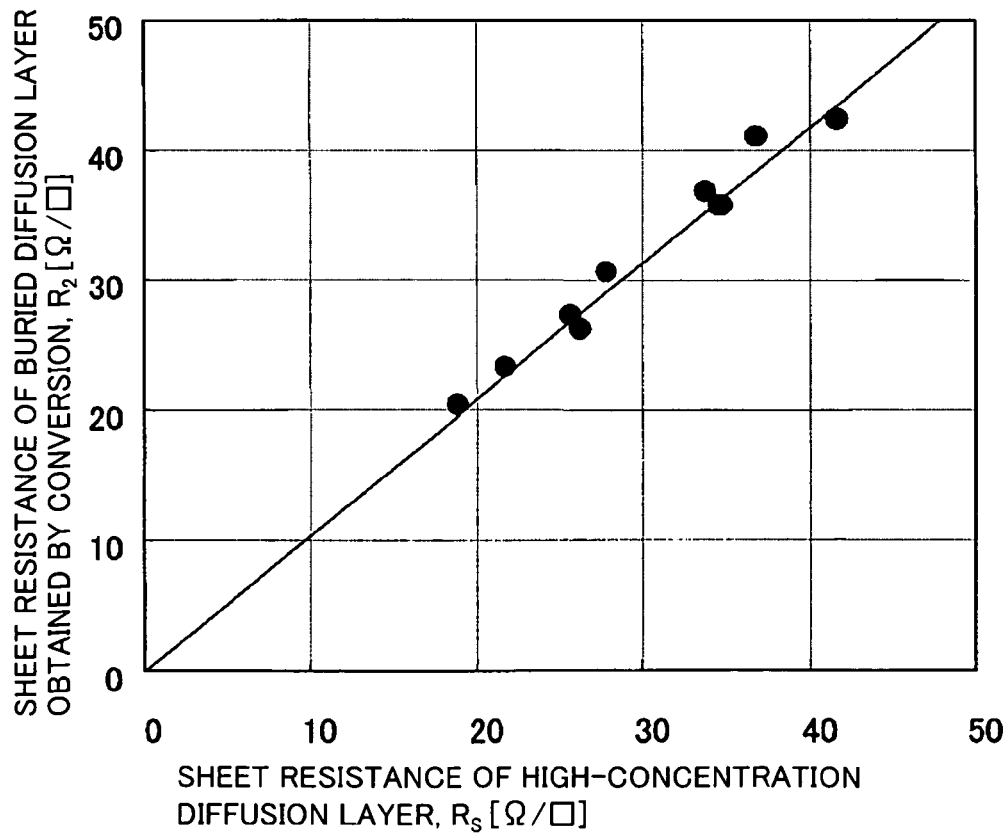
FIG. 10 is a graph showing a correlation between the sheet resistance of the buried diffusion layer evaluated with a method for evaluating the buried diffusion layer according to the four-point probe method of the present invention and the sheet resistance of the high concentration diffusion layer measured on the monitor wafer.

The obtained $R_2$ and the $R_s$ were compared with each other, and a relation between them was shown in FIG. 10. Note that a straight line in FIG. 10 is an approximate straight line with a least-squares method. As shown in FIG. 10, both the $R_2$ and $R_s$ were almost the same value even with any dose amount in the range of $2\times10^{15}$ atoms/cm$^2$ to $4\times10^{15}$ atoms/cm$_2$.

Namely, it means that also with the method for evaluating the buried diffusion layer according to the four-point probe method of the present invention, almost the same result as with the conventional monitor wafer method can be obtained. Consequently, the sheet resistance of the buried diffusion layer of the SOI wafer could be evaluated without fabricating the monitor wafer.

Note that the present invention is not limited to the above embodiments. The above-described embodiments are illustrations and have substantially the same configurations as technical ideas described in claims of the present invention, and thus anything that has similar effects is included in the technical scope of the present invention.

The invention claimed is:

1. A method for evaluating an SOI wafer in which a sheet resistance of a buried diffusion layer of an SOI wafer that has at least an SOI layer on an insulator layer and has a buried diffusion layer whose impurity concentration is higher than other region of the SOI layer in an interface area with the insulator layer of the SOI layer is evaluated, the method comprising the steps of:

measuring a sheet resistance of the whole SOI layer or the whole SOI wafer; and estimating the sheet resistance of the buried diffusion layer by converting the measured result of the sheet resistance measurement on the basis of assuming respective layers that compose the SOI wafer to be resistors connected in parallel, wherein the step of measuring the sheet resistance of the whole SOI wafer comprises the steps of:

radiating lines of magnetic force of an alternating current magnetic field to one surface of the SOI wafer to form eddy currents caused by the alternating current magnetic field on, the SOI wafer;

measuring variation of the magnetic field according to eddy current loss generated by the eddy current formation, on a surface opposite to the surface to which the lines of magnetic force are radiated; and calculating the sheet resistance of the whole SOI wafer from the measured variation of the magnetic field.

2. A method for evaluating an SOI wafer in which a sheet resistance of a buried diffusion layer of an SOI wafer that has at least an SOI layer on an insulator layer and has a buried diffusion layer whose impurity concentration is higher than other region of the SOI layer in an interface area with the insulator layer of the SOI layer is evaluated, the method comprising the steps of:

measuring a sheet resistance of the whole SOI layer or the whole SOI wafer; and estimating the sheet resistance of the buried diffusion layer by converting the measured result of the sheet resistance measurement on the basis of assuming respective layers that compose the SOI wafer to be resistors connected in parallel, wherein the step of measuring the sheet resistance of the whole SOI layer is performed by applying a four-point probe method to a surface of the SOI layer.

* * * * *